(12) United States Patent
Fletcher

(10) Patent No.: US 10,600,628 B1
(45) Date of Patent: Mar. 24, 2020

(54) RESONANT TRANSMISSION LINE TO DELIVER PRECISION RF VOLTAGE

(71) Applicant: MKS Instruments, Inc., Andover, MA (US)

(72) Inventor: William Roger Fletcher, Shropshire (GB)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 16/192,223

(22) Filed: Nov. 15, 2018

(51) Int. Cl.
| | |
|---|---|
| H01J 49/26 | (2006.01) |
| H01F 19/04 | (2006.01) |
| H01P 3/06 | (2006.01) |
| H01J 49/02 | (2006.01) |
| H01J 49/00 | (2006.01) |
| H03H 7/01 | (2006.01) |
| H01J 49/42 | (2006.01) |

(52) U.S. Cl.
CPC ............ H01J 49/022 (2013.01); H01F 19/04 (2013.01); H01J 49/0031 (2013.01); H01J 49/4225 (2013.01); H01P 3/06 (2013.01); H03H 7/0115 (2013.01)

(58) Field of Classification Search
CPC .. H01J 49/022; H01J 49/0031; H01J 49/4225; H01F 19/04; H01P 3/06; H03H 7/0115
USPC ......................................... 250/281, 282, 283
See application file for complete search history.

(56) References Cited

U.S. PATENT DOCUMENTS

| | | | |
|---|---|---|---|
| 2013/0076338 A1* | 3/2013 | Wang | G01R 19/155 |
| | | | 324/96 |
| 2016/0126738 A1* | 5/2016 | Moore | H02J 3/18 |
| | | | 361/35 |
| 2017/0104426 A1* | 4/2017 | Mills | H05H 1/24 |

FOREIGN PATENT DOCUMENTS

| | | |
|---|---|---|
| JP | S61140049 A | 6/1986 |
| JP | S63128545 A | 6/1988 |

OTHER PUBLICATIONS

International Search Report and Written Opinion for PCT/US2019/060558 dated Feb. 10, 2020, titled "Resonant Transmission Line to Deliver Precision RF Voltage".

* cited by examiner

Primary Examiner — Nicole M Ippolito
(74) Attorney, Agent, or Firm — Hamilton, Brook, Smith & Reynolds, P.C.

(57) ABSTRACT

A system for conveying a time-varying voltage signal from a first subsystem to a second subsystem, and for monitoring and controlling the time-varying voltage signal, comprises a transmission line having a first end and a second end, extending from the first end at the first subsystem to the second end at the second subsystem. The transmission line is configured to be un-terminated, and have an electrical length substantially equal to a multiple of one half wavelength of the time-varying voltage signal. The system may further comprise an adaptive control configured to couple the time-varying voltage signal to the first end, and adjust a generator of the time-varying voltage signal based on a sampling of the time-varying voltage signal at the first end, and at least one transformer at the second subsystem electrically coupled to the second end and configured to increase an amplitude of the time-varying voltage signal.

23 Claims, 4 Drawing Sheets

US 10,600,628 B1

RESONANT TRANSMISSION LINE TO DELIVER PRECISION RF VOLTAGE

BACKGROUND

Quadrupole Analyzers, as used in Residual Gas Analyzers (RGAs) and other Mass Spectrometers, require a precisely controlled two phase RF supply signal. The RF supply signal amplitude is of the order of hundreds of volts peak (Vpk) and its frequency is typically a few MHz. The actual voltage amplitude and frequency may depend on the required mass range and various properties of the quadrupole analyzer. A Quadrupole Analyzer application may, for example, utilize a RF supply signal with an amplitude of 187.6 Vpk at 1.8432 MHz, although other voltages and frequencies may be chosen to suit a particular analyzer and mass range.

A Quadrupole Analyzer generally comprises two primary subsystems—the quadrupole subsystem (also referred to herein as the "Vacuum System"), which hosts the quadrupole device and associated hardware, and the signal generation, control, and analysis subsystem, which hosts the RF signal generator, control and analysis components, and other support electronics.

The quadrupole subsystem may be placed in an ionizing radiation environment, which can degrade the semiconductor and other components of the control/analysis subsystem. To protect these vulnerable components, the control/analysis subsystem may be remotely located with respect to the quadrupole subsystem. In such a configuration, the quadrupole subsystem and the control/analysis subsystem may be connected by a cable or other communication medium and separated by a distance that is typically tens of meters.

The RF signal generator is typically a fixed frequency, crystal controlled component with an amplitude modulator configured to precisely control the RF signal amplitude through a control system. The control system comprises an accurate rectifier to measure the RF signal voltage at the quadrupole subsystem, and use the measurement as a feedback signal of the control system to maintain the RF signal amplitude at the required value. The RF signal generator and associated control system is generally a design that is well known in the art.

Common practice is to collocate the rectifier with the quadrupole analyzer subsystem to accurately measure amplitude of the RF signal being applied to the quadrupole. When the quadrupole is used in an ionizing radiation environment, the rectifier may be a thermionic diode type (e.g., vacuum tube), because a semiconductor diode would degrade and/or malfunction in the presence of ionizing radiation. The rectifier output signal must be passed back to the control/analysis subsystem, which is inconvenient and risks the introduction of noise. There is also the concern of obsolescence for the thermionic diode and the complication of implementing its required heater supply.

SUMMARY

The described embodiments are directed to methods of, and systems for, delivering an RF signal over distances substantially greater than are traversed in prior art systems (e.g., 15 m), and remotely measuring, at the control/analysis subsystem, the RF signal voltage amplitude as it exists at a quadrupole analyzer. Extending the distance that the RF signal propagates keeps the vulnerable components of the control/analysis subsystem safely away from the ionizing radiation environment. Remotely measuring the quadrupole RF signal voltage at the control/analysis subsystem facilitates situating the rectifier at a safe distance from the ionizing radiation environment of the quadrupole analyzer, enabling the use of a semiconductor rectifier and thus eliminating the need for a thermionic rectifier.

The described embodiments may comprise an open-ended transmission line, which is resonant at the frequency of the RF signal, extending between a quadrupole analyzer subsystem and a signal generation, control, and analysis subsystem. The resonant transmission line is configured to have an electrical length (i.e., effective line length) of one-half wavelength ($\lambda/2$) of the operating frequency, or integer multiples of $\lambda/2$. Example embodiments described herein may utilize a transmission line that, at an operating frequency of 1.8432 MHz, is approximately 52 meters ($\lambda/2 \times 1$) or 104 meters ($\lambda/2 \times 2$), although other integer multiples of 52 meters may alternatively be used.

When driven at its resonant frequency (i.e., the frequency at which the transmission line has an electrical length of $n*(\lambda/2)$, n being an integer), the resonant transmission line input and output voltages are substantially identical. Using a half wavelength, resonant transmission line, the RF signal voltage amplitude present at the quadrupole analyzer subsystem may therefore be accurately measured remotely, at the signal generation, control, and analysis subsystem, using a semiconductor diode as a rectifier. When at resonance, the transmission line impedance is purely resistive, which avoids inefficiencies associated with a complex impedance without requiring a matching termination at the receiving end of the transmission line.

The described embodiments may further comprise a pair of step-up transformers at the quadrupole analyzer end of the half wavelength transmission line. The step-up transformers facilitate the use of a lower voltage on the transmission line than is required at the quadrupole itself. In an example embodiment, the step-up transformers have a turns ratio of 1:5, although alternative embodiments may use other turns ratios. For this example embodiment, an RF signal with an amplitude of 187 Vpk at the quadrupole corresponds to an RF signal with an amplitude of approximately 37.4 Vpk on the transmission line. The lower voltage on the transmission line facilitates lower dissipation losses, as compared to a transmission line supplying the RF signals to the quadrupole without transformers.

A system is provided for conveying a time-varying voltage signal from a first subsystem to a second subsystem and for monitoring and adaptively controlling an amplitude of the time-varying voltage signal. The system comprises a transmission line having a first end and a second end, the transmission line extending from the first end at the first subsystem to the second end at the second subsystem. The transmission line is configured to have a physical length that corresponds to an electrical length for the transmission line substantially equal to a positive integer multiple of one half wavelength of the time-varying voltage signal, the transmission line configured to be resonant. An adaptive control facility at the first subsystem is configured to (i) electrically couple the time-varying voltage signal to the first end and (ii) adjust a generator of the time-varying voltage signal, based on a sampling of the time-varying signal at the first end to maintain the amplitude of the time-varying voltage signal at a required level. At least one transformer at the second subsystem is electrically coupled to the second end of the transmission line and configured to increase an amplitude of the time-varying voltage signal.

The first subsystem may include signal generation, control, and analysis electronics, and the second subsystem may include a quadrupole analyzer. The time-varying voltage signal may be a radio frequency voltage signal configured to be applied, through the at least one transformer, to quadrupole elements of the quadrupole analyzer.

The adaptive control facility may comprise a rectifier configured to sample the time-varying voltage signal at the first end of the transmission line and produce a feedback signal therefrom. The adaptive control facility may be configured to adjust a generator of a time-varying voltage signal, based on a sampling of the time-varying voltage signal at the first end, to maintain the amplitude of the time-varying voltage signal at a required level. The rectifier may be a semiconductor diode. A compensating diode may be electrically coupled to the rectifier. The compensating diode may be configured such that a change in a conduction voltage of the compensating diode with respect to temperature mitigates a change in a conduction voltage of the rectifier with respect to temperature.

At least one transmission line length, selected from an assortment of line lengths, may be added to the transmission line. The at least one transmission line length is configured to provide a coarse adjustment of the electrical length of the transmission line by adjusting the physical length of the transmission line if the transmission line is not within an adjustment range of a fine adjustment. Fine adjustment may be through an adjustable capacitor coupled in parallel to the first end of the transmission line, the adjustable capacitor configured to provide compensation to place the transmission line in resonance.

A tunable tank circuit may be configured to receive an excitation signal from the signal generator and to resonate at a frequency of the excitation signal to produce the time-varying voltage signal.

The at least one transformer may comprise two transformers electrically coupled to the time-varying voltage signal to produce two phases of the time-varying voltage signal. Or the at least one transformer may comprise a single transformer having a primary winding and two secondary windings, the two secondary windings configured to produce two phases of the time-varying voltage signal applied to the primary winding.

The transmission line may be a component of a cable assembly, the cable assembly incorporating one or more communication path for conveying one or more of information, control signals, and power between the first subsystem and the second subsystem. The first subsystem may be located at least a half wavelength from the second subsystem. For example, the first subsystem may be located at least 30 meters from the second subsystem, or at least 50 meters from the second subsystem.

In a method of conveying a time-varying voltage signal from a first subsystem to a second subsystem, and for monitoring and adaptively controlling an amplitude of the time-varying voltage signal, a time-varying voltage signal is electrically coupled to a first end of the transmission line, the transmission line extending from the first end at the first subsystem to a second end at the second subsystem. A physical length of the transmission line is configured to correspond to an electrical length substantially equal to a positive integer multiple of one half wavelength of the time-varying voltage signal. At an adaptive control facility at the first subsystem, a generator of the time-varying voltage signal is adjusted, based on a sampling of the time-varying voltage signal at the first end, to maintain the amplitude of the time-varying voltage signal at a required level. An amplitude of the time-varying voltage signal is increased with at least one transformer at the second subsystem, the at least one transformer electrically coupled to the second end.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

The teachings of all patents, published applications and references cited herein are incorporated by reference in their entirety.

The described embodiments are directed to delivering an RF signal over distances substantially greater than are traversed in prior art systems, and remotely measuring, at the control/analysis subsystem, the RF signal voltage amplitude as it exists at a quadrupole analyzer. In general, the described embodiments utilize a resonant transmission line, configured such that its electrical length is one half the wavelength of the RF signal, to convey the RF signal to the quadrupole analyzer. A property of a resonant transmission line is that it manifests the same RF voltage amplitude at both ends of the transmission line.

Figure 1A:
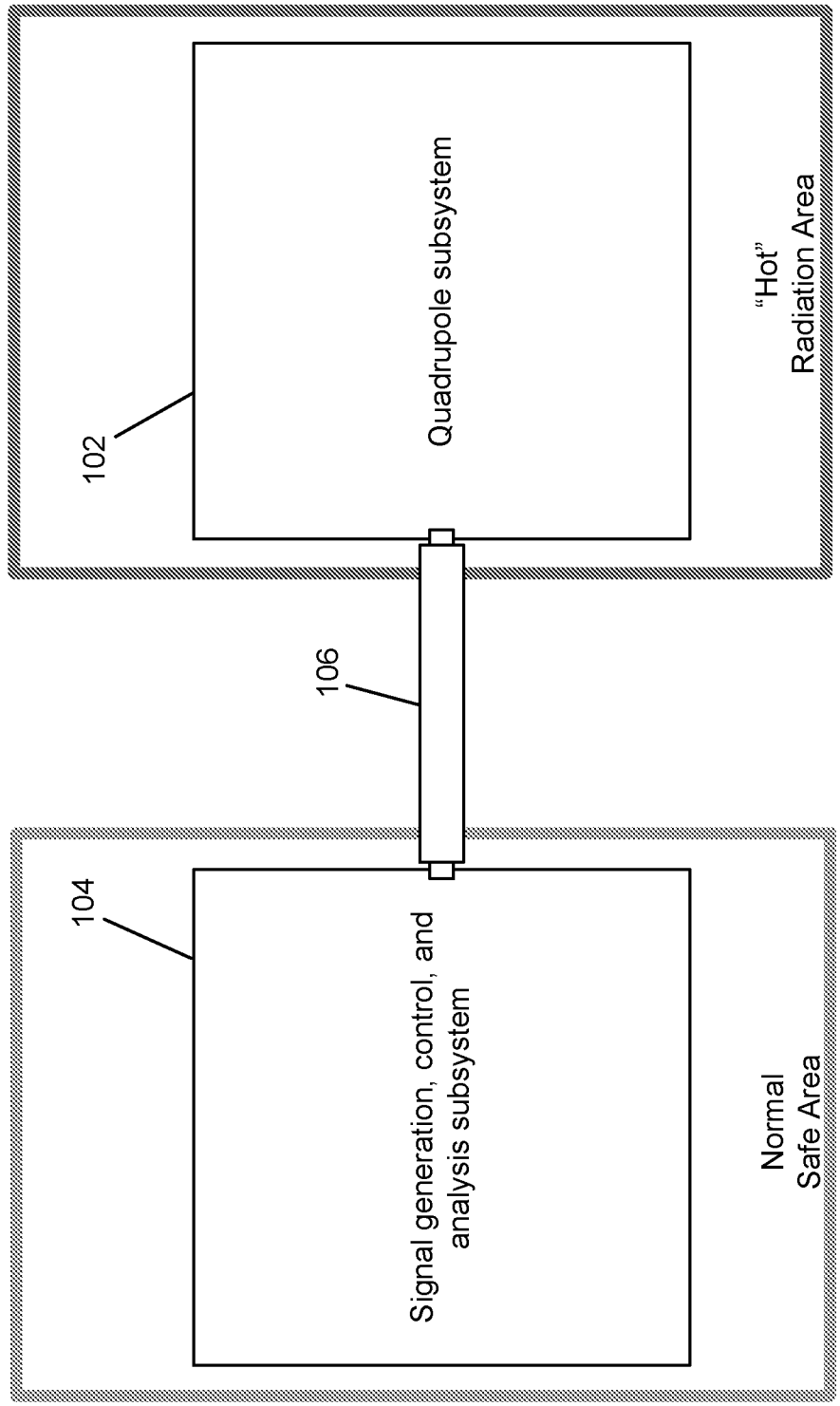
FIG. 1A depicts an example of a mass spectrometer system according to the invention.

FIG. 1A depicts an example of a mass spectrometer system 100 in which the described embodiments may be employed. The system 100 may comprise a quadrupole subsystem 102, a signal generation, control, and analysis subsystem 104, and a cable assembly 106 that connects the subsystems 102, 104. The quadrupole subsystem 102 may reside in a hostile environment, e.g., a "hot" radiation area, while the signal generation, control, and analysis subsystem 104 may reside in a normal, safe area set away from the hostile environment. The distance away from the hostile environment necessary to be considered a safe environment depends on the nature of the hostile environment. While a less-hostile environment may require a distance (and thus a cable 106 length) of 5 to 15 meters, more severe environments (e.g., nuclear physics applications such as particle accelerators and high-density neutron generators) may require a separation of 50 meters or more.

Figure 1B:
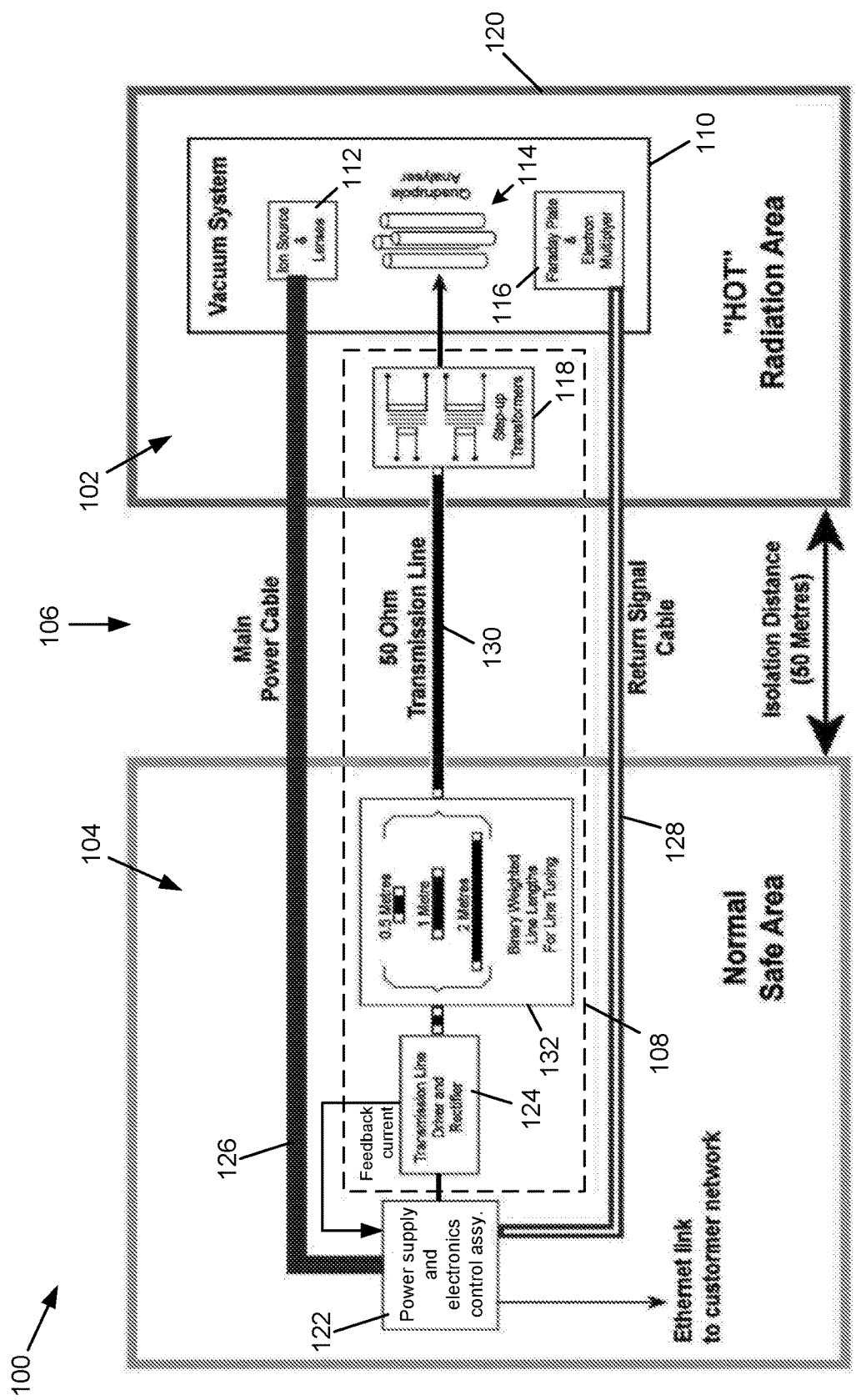
FIG. 1B illustrates a more detailed view of the example mass spectrometer shown in FIG. 1A.

FIG. 1B illustrates a more detailed view of the example mass spectrometer 100 shown in FIG. 1A. Elements of the described embodiments of a system for conveying a time-varying voltage signal 108 are depicted within a dashed box. These elements will be described in more detail below, following a description of the overall system in which the described embodiments reside.

The quadrupole subsystem 102 may comprise a vacuum system 110, which comprises an ion source and lenses assembly 112, a quadrupole analyzer 114, a Faraday plate and electron multiplier assembly 116, and a pair of step-up transformers 118. The quadrupole subsystem 110 may operate in an ionizing radiation environment, that is, a "hot" radiation area 120.

The signal generation, control, and analysis subsystem 104 is an adaptive control facility that may comprise a power supply and electronics control system assembly 122, and a transmission line driver and rectifier assembly 124.

The cable assembly 106, which preferably includes the illustrated cables and signal lines in a single cable sheath, may comprise a main power cable 126 that conveys power from the power supplies and electronics control system assembly 122 to the ion source and lenses assembly 112. The cable assembly 106 may further comprise a return signal cable 128 that conveys detection signals from the Faraday plate and electron multiplier assembly 116 to the power supply and electronics control assembly 122. The cable assembly 106 may further comprise a coaxial transmission line 130, and one or more binary weighted line lengths 132.

Figure 2:
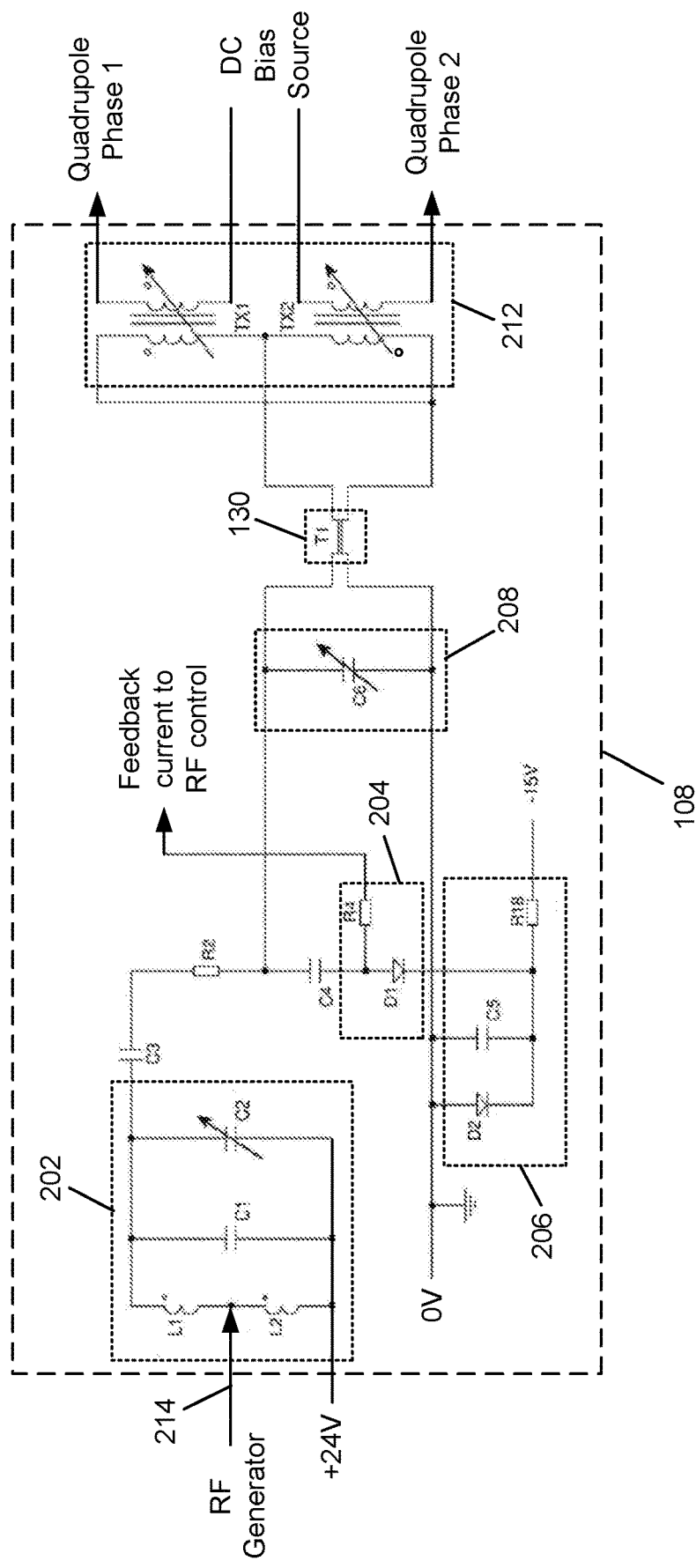
FIG. 2 shows a more detailed view of an example embodiment of the system for conveying a time-varying voltage signal according to the invention.

FIG. 2 shows a more detailed view of an example embodiment of the system 108 for conveying a time-varying voltage signal according to the invention. The example embodiment comprises a tuned tank circuit 202, a rectifier circuit 204, a temperature compensation circuit 206, an effective line length adjusting component 208, a half wavelength transmission line 130, and transformers 212.

The tuned circuit 202 receives an RF signal 214 from a crystal-controlled RF generator within the power supply and electronics control assembly 122. Values of components L1, L2 and C1 are selected to form a tank circuit that resonates at the frequency of the RF signal 214, reducing the harmonics from the modulator and maximizing the amplitude at the resonant frequency. The variable capacitor C2 may be used to adjust the resonant frequency to match the frequency of the RF signal 214. The tuned circuit 202 drives the RF signal to the transmission line 130 through capacitor C3, which provides DC isolation, and through drive impedance R2. The drive impedance R2 provides a buffer during a system power-up transition, when resonant components may not yet be in tune. During such a transition, unpredictable reflections may flash along the transmission path, which could damage constituent components. The drive impedance R2 may mitigate such reflections. At steady-state, when the resonant components are in tune, R2 presents a matched impedance to the transmission line 130.

The rectifier circuit 204 employs a semiconductor diode D1 to rectify a representative sample of the RF voltage signal at the input of the transmission line 130. The rectified sample passes through R4 to produce a feedback current, which is conveyed to the power supply and electronics control assembly 122. The feedback current is used by a control system in the power supply and electronics control assembly 122 to adaptively maintain the RF signal amplitude at the required value.

Diode D1 is affected by a temperature coefficient, such that as the temperature of diode D1 increases, the forward conduction voltage of D1 decreases on the order of a few millivolts per ° C. The RF signal voltage requires precise control for use with the quadrupole analyzer. Because the RF signal voltage has a relatively wide dynamic range, an error caused by the temperature coefficient over the system operating temperature range may adversely affect operation at the lower end of the dynamic range.

The temperature compensation circuit 206 operates to counteract the effects of the D1 temperature coefficient. The temperature compensation circuit 206 comprises diode D2, which is electrically coupled in opposition to diode D1, and situated close enough to diode D1 that D1 and D2 experience substantially the same ambient temperature. Diode D2 is biased through R18 by a −15V source. Diode D2 is selected to have substantially the same temperature coefficient as diode D1, so as the common ambient temperature changes, a change in the bias point of D2 shifts the bias point of D1 by an equal amount.

The transmission line 130 receives the RF signal from the tuned circuit 202 through capacitor C3 and drive impedance R2. The transmission line 130 is configured to have a physical length that approximates an electrical length (also referred to herein as effective length) that is one half the wavelength ($\lambda$) of the RF signal. For this electrical length, or an integral multiple of that length, the transmission line 130 is resonant at the frequency of the RF signal. The wavelength of a signal in a transmission line is given by:

$$\lambda = \frac{(3 \times 10^8)v}{f} m,$$

where f is the frequency of the RF signal, and v is the velocity factor of the propagation medium. In an example embodiment, the transmission line 130 is RG58 coaxial cable, which has a specified velocity factor v of 0.66. At an RF signal frequency of 1.8432 MHz and using the specified velocity factor, a $\lambda/2$ electrical length for RG58 cable should be 53.71 m. In practice however, resonance occurs at a transmission line length of 51.79 m, implying that the actual velocity factor is approximately 0.6364.

The transmission line 130 may be adjusted or "tuned" to provide the appropriate electrical length to resonate at the frequency of the RF signal through one or both of two adjustment resources. A coarse adjustment, required only if the transmission line is not within the fine adjustment range of capacitor C6 noted below, may be accomplished by inserting one or more line lengths 132, as shown in FIG. 1B. These line lengths 132 may adjust the electrical length of the transmission line 130 by simply changing its physical length. Although the example embodiment shown in FIG. 1B depicts binary weighted line lengths 132 of 2 m, 1 m and 0.5 m, other values of binary or otherwise weighted line lengths 132 may be used in addition to or instead of the values listed.

A fine adjustment may be accomplished by manipulating the variable capacitor C6 at the driving side of the transmission line 130. The variable capacitor C6 operates as a reactive load on the transmission line 130, and the value of C6 may be adjusted so that the combination of the variable capacitor C6 and the transmission line resonates at the frequency of the RF signal.

An example procedure for tuning the transmission line 130 may be to apply the RF signal to the transmission line 130 and observe the RF signal voltage at the transmission line input. Transmission line lengths 132 may be selectively added to the transmission line 130 until a maximum of the RF signal voltage is observed. The variable capacitor C6 may then be adjusted until a maximum of the RF signal voltage is observed. Other tuning procedures known in the art may alternatively be used.

Transformers 212 receive the RF signal propagated by the transmission line 130, and step up the RF signal voltage for use by the quadrupole analyzer 114. The transformers receive opposite polarities of the RF signal, so that the transformers produce different phases of the stepped-up RF signal voltage, with one transformer output shifted by 180 degrees from the other.

In an example embodiment, the transformers 212 may comprise two separate but tightly-coupled transformers, each with a 1:5 turns ratio, such that the RF signal voltage at the output of the transformer is five times that of the RF signal voltage at the input of the transformer. It should be understood, however, that other turns ratios may alternatively be used. The transformers are also adjustable to tune the quadrupole capacitance. In another example embodiment, the transformers 212 may comprise a single transformer with one primary winding and two secondary windings. With the step-up transformers, a reduced voltage signal can be transmitted over the transmission line to keep losses, which are proportional to the square of the RF signal voltage, to an acceptable level. In an embodiment, one or both of the transformers may have adjustable taps to facilitate adjusting secondary winding output voltage with respect to the primary winding input voltage.

Figure 3:
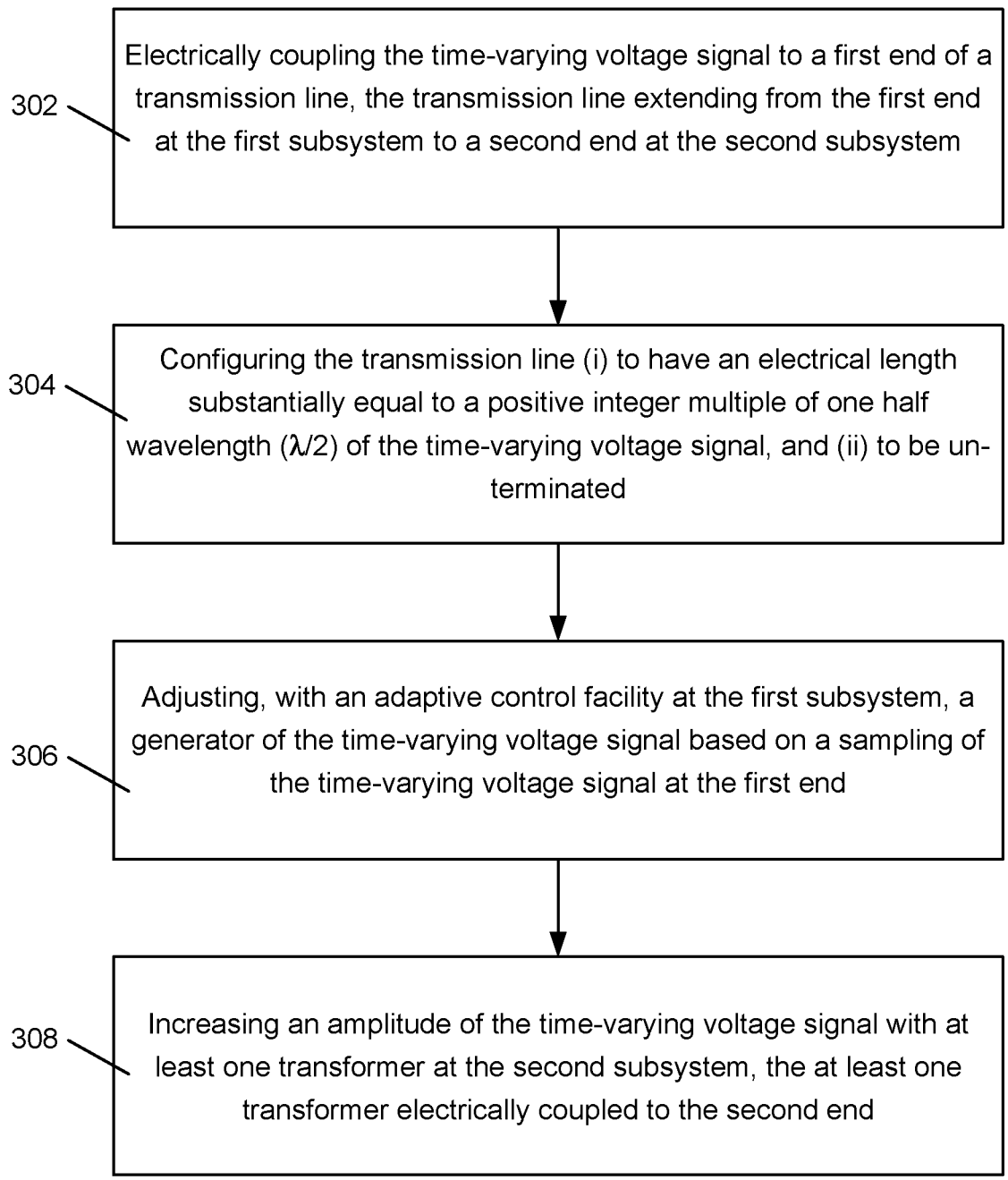
FIG. 3 illustrates an example method of conveying a time-varying voltage signal from a first subsystem to a second subsystem, and for monitoring and adaptively controlling an amplitude of the time-varying voltage signal, according to the invention.

FIG. 3 illustrates an example method 300 of conveying a time-varying voltage signal from a first subsystem to a second subsystem and for monitoring and adaptively controlling an amplitude of the time-varying voltage signal according to the invention. The method may comprise electrically coupling 302 the time-varying voltage signal to a first end of a transmission line, the transmission line extending from the first end at the first subsystem to a second end at the second subsystem. The method may further comprise configuring 304 the transmission line (i) to have an electrical length substantially equal to a positive integer multiple of one half wavelength ($\lambda/2$) of the time-varying voltage signal, and (ii) to be un-terminated. The method may further comprise adjusting 306, with an adaptive control facility at the first subsystem, a generator of the time-varying voltage signal based on a sampling of the time-varying voltage signal at the first end. The method may further comprise increasing 308 an amplitude of the time-varying voltage signal with at least one transformer at the second subsystem, the at least one transformer electrically coupled to the second end.

While example embodiments have been particularly shown and described, it will be understood by those skilled in the art that various changes in form and details may be made therein without departing from the scope of the embodiments encompassed by the appended claims.

What is claimed is:

1. A system for conveying a time-varying voltage signal from a first subsystem to a second subsystem, and for monitoring and adaptively controlling an amplitude of the time-varying voltage signal, comprising:
a transmission line having a first end and a second end, the transmission line extending from the first end at the first subsystem to the second end at the second subsystem, the transmission line configured to have a physical length that corresponds to an electrical length of the transmission line substantially equal to a positive integer multiple of one half wavelength of the time-varying voltage signal, the transmission line configured to be resonant;
an adaptive control facility at the first subsystem, the adaptive control facility configured to (i) electrically couple the time-varying voltage signal to the first end, and (ii) adjust a generator of the time-varying voltage signal, based on a sampling of the time-varying voltage signal at the first end, to maintain the amplitude of the time-varying voltage signal at a required level; and
at least one transformer at the second subsystem, the at least one transformer electrically coupled to the second end and configured to increase an amplitude of the time-varying voltage signal.

2. The system of claim 1, comprising the first subsystem including signal generation, control, and analysis electronics, and the second subsystem including a quadrupole analyzer, and wherein the time-varying voltage signal is a radio frequency voltage signal configured to be applied, through the at least one transformer, to quadrupole elements of the quadrupole analyzer.

3. The system of claim 1, wherein the adaptive control facility comprises a rectifier configured to sample the time-varying voltage signal at the first end of the transmission line and produce a feedback signal therefrom.

4. The system of claim 3, wherein the rectifier is a semiconductor diode.

5. The system of claim 4, further comprising a compensating diode electrically coupled to the rectifier, the compensating diode configured such that a change in a conduction voltage of the compensating diode with respect to temperature mitigates a change in a conduction voltage of the rectifier with respect to temperature.

6. The system of claim 1, further comprising at least one transmission line length, selected from an assortment of line lengths, added to the transmission line, the at least one transmission line length configured to provide a coarse adjustment of the electrical length of the transmission line by adjusting the physical length of the transmission line.

7. The system of claim 1, further comprising an adjustable capacitor coupled in parallel to the first end of the transmission line, the adjustable capacitor configured to provide compensation to place the transmission line in resonance.

8. The system of claim 1, further comprising a tunable tank circuit configured to receive an excitation signal from a signal generator and to resonate at a frequency of the excitation signal to produce the time-varying voltage signal.

9. The system of claim 1, wherein the at least one transformer comprises two transformers electrically coupled to the time-varying voltage signal to produce two phases of the time-varying voltage signal.

10. The system of claim 1, wherein the at least one transformer comprises a single transformer having a primary winding and two secondary windings, the two secondary windings configured to produce two phases of the time-varying voltage signal applied to the primary winding.

11. The system of claim 1, wherein the transmission line is a component of a cable assembly, the cable assembly incorporating one or more communication paths for conveying one or more of information, control signals, and power between the first subsystem and the second subsystem.

12. The system of claim 11, wherein the first subsystem is located at least a half wavelength from the second subsystem.

13. The system of claim 11, wherein the first subsystem is located at least 30 meters from the second subsystem.

14. A method of conveying a time-varying voltage signal from a first subsystem to a second subsystem, and for monitoring and adaptively controlling an amplitude of the time-varying voltage signal, comprising:
electrically coupling the time-varying voltage signal to a first end of a transmission line, the transmission line extending from the first end at the first subsystem to a second end at the second subsystem, configuring a physical length of the transmission line to correspond to an electrical length substantially equal to a positive integer multiple of one half wavelength of the time-varying voltage signal;

adjusting, at an adaptive control facility at the first subsystem, a generator of the time-varying voltage signal, based on a sampling of the time-varying voltage signal at the first end, to maintain the amplitude of the time-varying voltage signal at a required level; and increasing an amplitude of the time-varying voltage signal with at least one transformer at the second subsystem, the at least one transformer electrically coupled to the second end.

15. The method of claim 14, further sampling the time-varying voltage signal at the first end of the transmission line and producing a feedback signal therefrom.

16. The method of claim 14, further adding at least one binary-weighted transmission line length, selected from an assortment of transmission line lengths, to the transmission line to provide a coarse adjustment of the electrical length of the transmission line by adjusting the physical length of the transmission line.

17. The method of claim 14, further adjusting a adjustable capacitor coupled in parallel to the first end of the unterminated transmission line to provide compensation to place the transmission line in resonance.

18. A system for conveying a time-varying voltage signal from a signal generation, control, and analysis first subsystem to a quadrupole analyzer second subsystem, and for monitoring and adaptively controlling an amplitude of the time-varying voltage signal, comprising:

the signal generation, control, and analysis first subsystem, the quadrupole analyzer second subsystem having a quadrupole analyzer, the time-varying voltage signal being a radio frequency voltage signal configured to be applied, through at least one transformer, to quadrupole elements of the quadrupole analyzer;

a transmission line having a first end and a second end, the transmission line extending from the first end at the first subsystem to the second end at the second subsystem, the transmission line configured to have an electrical length substantially equal to a positive integer multiple of one half wavelength of the time-varying voltage signal;

a rectifier circuit configured to sample the time-varying voltage coupled to the first end to produce a feedback signal, and convey the feedback signal in an adaptive control facility, the adaptive control facility configured to adjust a generator of the time-varying voltage signal, based on a sampling of the time-varying voltage signal at the first end, to maintain the amplitude of the time-varying voltage signal at a required level; and at least one transformer at the second subsystem, the at least one transformer electrically coupled to the second end and configured to increase an amplitude of the time-varying voltage signal.

19. The system of claim 18, further comprising a temperature compensation circuit electrically coupled to the rectifier, the temperature compensation circuit configured to mitigate a change in a conduction voltage of the rectifier with respect to temperature according to a change in a conduction voltage of the compensating diode with respect to temperature.

20. The system of claim 18, further comprising at least one transmission line length, selected from an assortment of line lengths, added to the transmission line, the at least one transmission line length configured to provide a coarse adjustment of the electrical length of the transmission line by adjusting the physical length of the transmission line.

21. The system of claim 18, further comprising an adjustable capacitor coupled in parallel to the first end of the transmission line, the adjustable capacitor configured to provide compensation to place the transmission line in resonance.

22. A method of conveying a time-varying voltage signal from a signal generation, control, and analysis subsystem to a quadrupole analyzer, and for monitoring and adaptively controlling an amplitude of the time-varying voltage signal, comprising:

electrically coupling the time-varying voltage signal to a first end of a transmission line, the transmission line extending from the first end at the signal generation, control, and analysis subsystem to a second end at the quadrupole analyzer, configuring a physical length of the transmission line to correspond to an electrical length substantially equal to a positive integer multiple of one half wavelength of the time-varying voltage signal;

sampling, with a rectifier circuit, the time-varying voltage coupled to the first end to produce a feedback signal, and conveying the feedback signal to an adaptive control facility, the adaptive control facility configured to adjust a generator of the time-varying voltage signal, based on a sampling of the time-varying voltage signal at the first end, to maintain the amplitude of the time-varying voltage signal at a required level; and increasing an amplitude of the time-varying voltage signal with at least one transformer at the second subsystem, the at least one transformer electrically coupled to the second end.

23. The method of claim 22, further mitigating a change in a conduction voltage of the rectifier with respect to temperature according to a change in a conduction voltage of the compensating diode with respect to temperature.

* * * * *